(12) United States Patent
Jeon et al.

(10) Patent No.: US 9,478,559 B2
(45) Date of Patent: Oct. 25, 2016

(54) SEMICONDUCTOR DEVICE AND METHOD OF FABRICATING THE SAME

(71) Applicant: SK hynix Inc., Gyeonggi-do (KR)

(72) Inventors: Jae Eun Jeon, Seoul (KR); Sung Lae Oh, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/694,829

(22) Filed: Apr. 23, 2015

(65) Prior Publication Data

US 2016/0133642 A1 May 12, 2016

(30) Foreign Application Priority Data

Nov. 11, 2014 (KR) .......................... 10-2014-0156441

(51) Int. Cl.
*H01L 29/00* (2006.01)
*H01L 27/115* (2006.01)

(52) U.S. Cl.
CPC ... *H01L 27/11582* (2013.01); *H01L 27/11565* (2013.01)

(58) Field of Classification Search
CPC .................. H01L 29/792; H01L 27/11582
See application file for complete search history.

(56) References Cited

U.S. PATENT DOCUMENTS

| 2012/0058629 | A1* | 3/2012 | You | H01L 27/11582 438/479 |
| 2012/0299086 | A1* | 11/2012 | Lee | H01L 27/1157 257/324 |
| 2014/0084358 | A1 | 3/2014 | Lee et al. | |
| 2014/0193966 | A1 | 7/2014 | You et al. | |

FOREIGN PATENT DOCUMENTS

| KR | 1020100024096 | 3/2010 |
| KR | 1020140041123 | 4/2014 |

* cited by examiner

*Primary Examiner* — Tran Tran
(74) *Attorney, Agent, or Firm* — IP & T Group LLP

(57) ABSTRACT

A semiconductor device and a method of fabricating the same are disclosed. The semiconductor device includes: a memory cell structure formed over a semiconductor substrate; a channel portion formed in the semiconductor substrate; a through-hole formed to pass through the memory cell structure; a first channel region formed over sidewalls of the through-hole; and a second channel region formed at a center part of the through-hole, and spaced apart from the first channel region, wherein each of the first channel region and the second channel region is coupled to the channel portion.

9 Claims, 13 Drawing Sheets

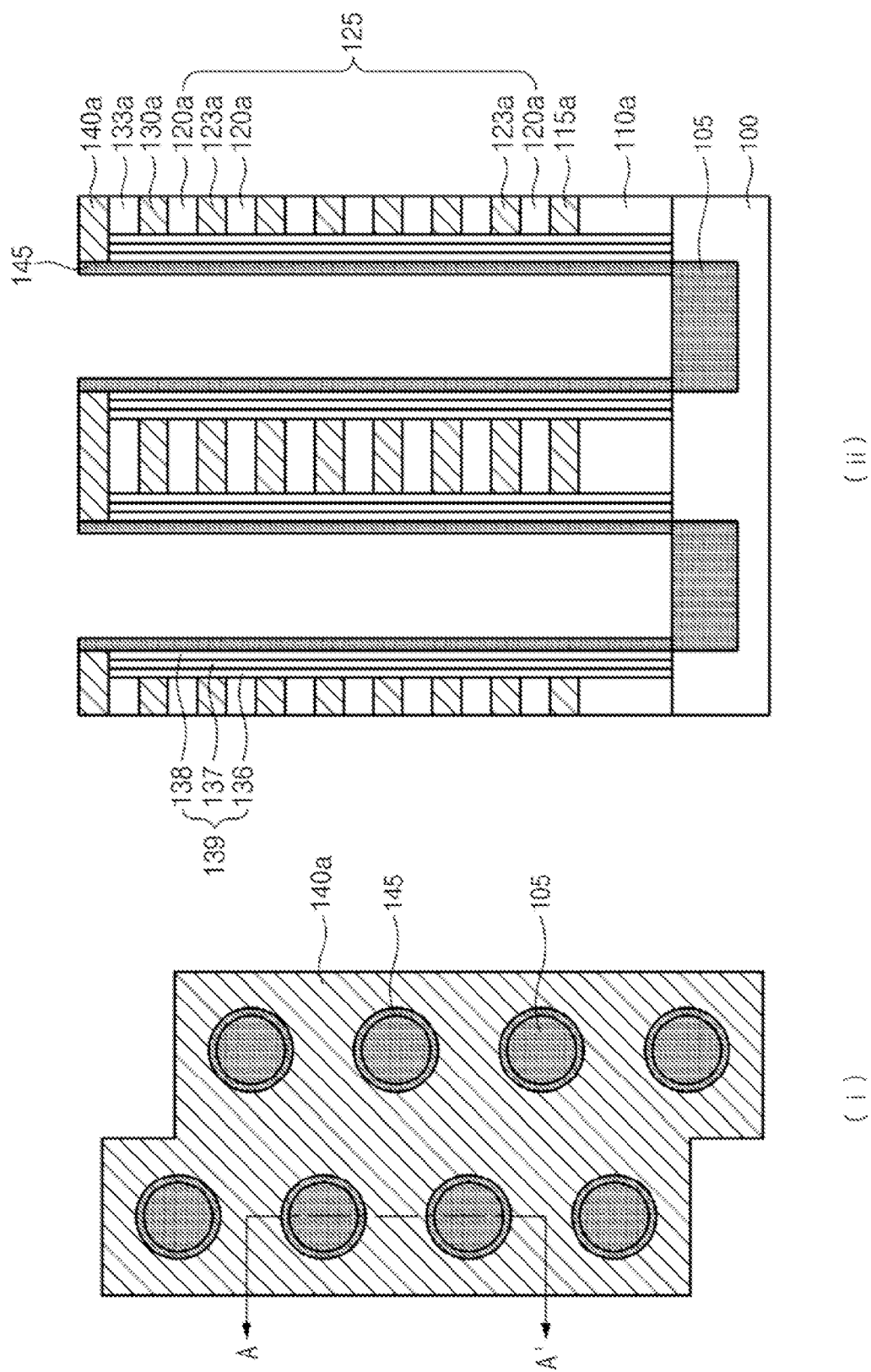

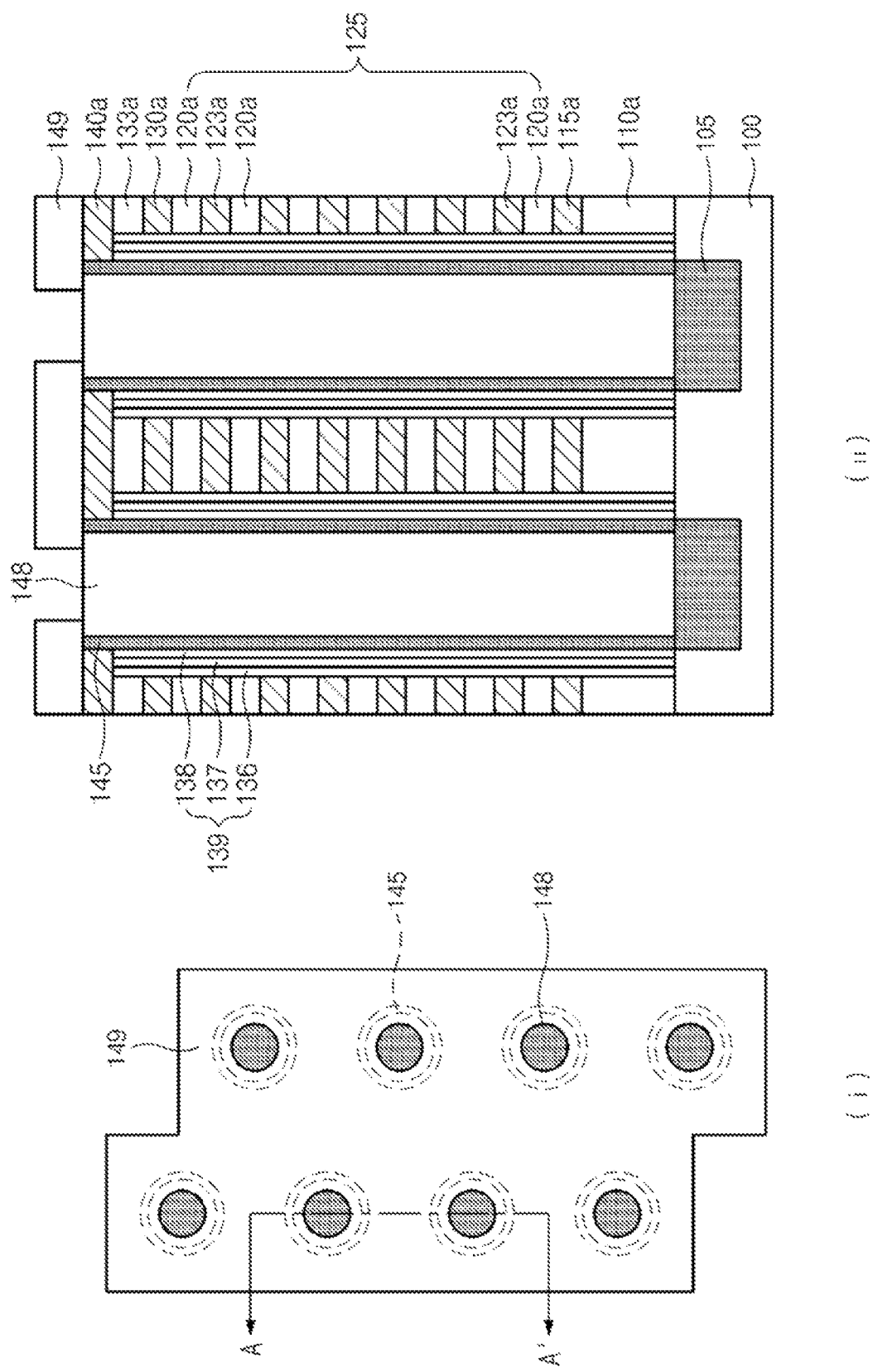

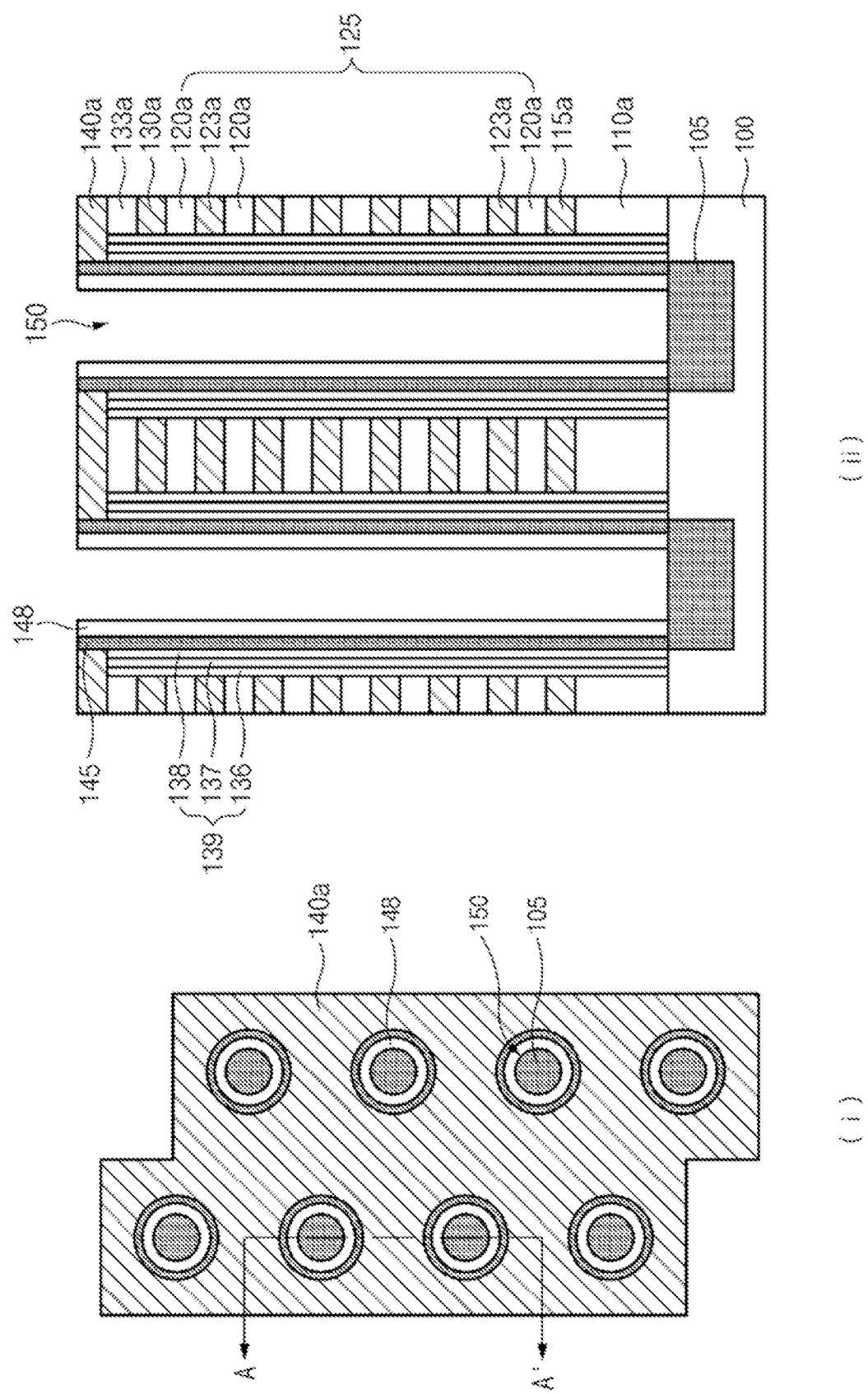

SEMICONDUCTOR DEVICE AND METHOD OF FABRICATING THE SAME

CROSS-REFERENCE TO RELATED APPLICATION

This application claims priority of Korean patent application No. 10-2014-0156441, filed on 11 Nov. 2014, the disclosure of which is hereby incorporated in its entirety by reference.

BACKGROUND OF THE INVENTION

Embodiments of the present invention relate to a semiconductor device and a method of fabricating the same and, more particularly, to a three-dimensional (3D) flash memory device and a method of fabricating the same.

In general, semiconductor memory devices for storing data are classified into volatile memory devices and non-volatile memory devices. Whereas data stored in volatile memory devices is lost when its power supply is stopped, non-volatile memory devices are able to retain data irrespective of whether power is supplied thereto.

Therefore, non-volatile memory devices have been widely used in various applications such as mobile phone systems as well as memory cards for storing music and/or video data. Non-volatile memory may also be used in devices where the power supply may be occasionally interrupted, or when low power consumption is required. An example of a non-volatile memory device includes a flash memory device having data capable of being simultaneously erased. The demand of smaller-sized cells is also increasing in the flash memory devices.

Meanwhile, since the integration enhancement of two-dimensional (2D) non-volatile memory devices (in which a single-layered memory device is formed over a semiconductor substrate) is limited, a three-dimensional (3D) non-volatile memory device has been introduced in which memory cells are stacked vertically from the semiconductor substrate.

FIGS. 1A and 1B respectively illustrate a cross-sectional view and a circuit diagram of a conventional semiconductor device.

Referring to FIGS. 1A and 1B, a pipe gate (PG) 13 is formed over a semiconductor substrate 10, a memory cell structure 25 is formed by repeatedly stacking a first insulation film 20 and a word line 23 over the pipe gate (PG) 13, a source selection line (SSL) 30 is formed at one side of an upper portion of the memory cell structure 25, a drain selection line (DSL) 15 is formed at the other side of the upper portion of the memory cell structure 25, and a second insulation film 33 is formed over the drain selection line (DSL) 15 and the source selection line (SSL) 30.

One pair of cell channel holes 41a and 41b is arranged to pass through the memory cell structure 25, the drain selection line (DSL) 15, and the source selection line (SSL) 30. A pipe channel hole 41c for interconnecting the cell channel holes 41a and 41b may be arranged below the memory cell structure 25. An oxide-nitride-oxide (ONO) dielectric layer 39 is formed along inner walls of the cell channel holes 41a and 41b and the pipe channel hole 41c, and a pipe channel region 45 is formed by forming a channel film (not shown) over the ONO dielectric layer 39.

One side of the pipe channel region 45 is coupled to a source line (SL) 40, and the other side of the pipe channel region 45 is coupled to a bit line (BL) 54.

Since a space for interconnecting the source line (SL) 40 to an upper metal line (not shown) is additionally required for the above-mentioned 3D memory cell structure, space utilization deteriorates.

In addition, a pipe-channel-shaped 3D memory cell structure that is configured work with the pipe gate (PG) is highly difficult to fabricate, and therefore requires a complex fabrication process.

BRIEF SUMMARY OF THE INVENTION

Various embodiments of the present invention are directed to providing a semiconductor device and a method of fabricating the same that obviate one or more problems in the related art.

An embodiment of the present invention relates to a semiconductor device in which a coupling region between a source line and a bit line is located in a cell string structure to increase space utilization and minimize the number of fabrication steps, and a method of fabricating the same.

In accordance with an aspect of the present invention, a semiconductor device includes: a memory cell structure formed over a semiconductor substrate; a channel portion formed in the semiconductor substrate; a through-hole formed to pass through the memory cell structure; a first channel region formed over sidewalls of the through-hole; and a second channel region formed at a center part of the through-hole, and spaced apart from the first channel region.

A channel portion formed in the semiconductor substrate.

Each of the first channel region and the second channel region is coupled to the channel portion.

A lower part of the first channel region is coupled to a lower part of the second channel region.

A drain selection line (DSL) formed below the memory cell structure; and a source selection line (SSL) formed over the memory cell structure.

A source line formed over the memory cell structure, coupled to the first channel region at both sides of the first channel region, and extended parallel to the memory cell structure.

A bit line coupled to an upper part of the second channel region, and extended perpendicular to the memory cell structure.

The memory cell structure is formed by alternately stacking an insulation film and a word line over the semiconductor substrate.

The word line includes poly silicon or metal.

A charge storage region formed over the sidewalls of the through-hole, and disposed between the memory cell structure and the first channel region.

The charge storage region includes an oxide-nitride-oxide (ONO) dielectric layer.

In accordance with another aspect of the present invention, a method of fabricating a semiconductor device includes: forming a memory cell structure over a semiconductor substrate; forming a through-hole exposing the semiconductor substrate by etching the memory cell structure; forming a first channel region over sidewalls of the through-hole; and forming a second channel region spaced apart from the first channel region at a center part of the through-hole, wherein each of the first channel region and the second channel region is coupled to the channel portion.

Forming an insulation film and a drain selection line (DSL) over the semiconductor substrate before forming the memory cell structure.

Alternately stacking insulation films and word lines over the semiconductor substrate.

Forming a source selection line (SSL) and an insulation film over the memory cell structure.

Forming a charge storage region over the sidewalls of the through-hole before forming the first channel region.

Forming the charge storage region includes: depositing a first oxide film and a nitride film over an entire surface of the semiconductor substrate including the through-hole; performing an etching process in a manner such that the first oxide film and the nitride film remain over the sidewalls of the through-hole; filling a second oxide film into the through-hole; forming a source line over an entire surface of a resultant structure including the through-hole filled with the second oxide film; and etching the source line and the second oxide film until the semiconductor substrate is exposed, and forming the charge storage region including the first oxide film, the nitride film and the second oxide film remaining over the nitride film.

The source line is coupled to the first channel region, and extends parallel to the memory cell structure.

Forming a channel portion in the semiconductor substrate by implanting impurity ions into the semiconductor substrate.

Forming the first channel region includes: forming a conductive material over the semiconductor substrate including the through-hole; forming a mask pattern to cover a part of the conductive material over the semiconductor substrate; and etching the conductive material using the mask pattern as an etch mask in a manner such that the part of the conductive material remains over the sidewalls of the through-hole, wherein the first channel region is coupled to the channel portion.

The forming the first channel region includes: forming a conductive material over the semiconductor substrate including the through-hole; and performing an etching process on the conductive material in a manner such that the conductive material remains over the sidewalls of the through-hole, wherein the first channel region is coupled to the channel portion.

Forming the first channel region includes: forming a conductive material over the semiconductor substrate including the through-hole; and etching the conductive material in a manner such that the conductive material remains over the sidewalls and a lower part of the through-hole, wherein the lower part of the first channel region is coupled to a lower part of the second channel region portion.

The forming the second channel region includes: filling an insulation film into the through-hole including the first channel region;

forming a mask pattern exposing the center part of the through-hole over a resultant structure including the memory cell structure, the first channel region and a part of the insulation film adjacent to the first channel region; and etching the insulation film using the mask pattern as an etch mask until the semiconductor substrate is exposed in a manner such that the part of the insulation film remains over sidewalls of the first channel region; and filling a conductive material between the etched insulation films.

The second channel region is coupled to the first channel region through the channel portion.

Forming a bit line coupled to an upper part of the second channel region.

The bit line extends perpendicular to the memory cell structure.

It is to be understood that both the foregoing general description and the following detailed description of embodiments are exemplary and explanatory.

BRIEF DESCRIPTION OF THE DRAWINGS

FIGS. 3A to 3I are plan views and cross-sectional views illustrating a method of fabricating a semiconductor device according to an embodiment.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of known configurations or functions will be omitted when it may make the subject matter less clear.

Figure 1A:
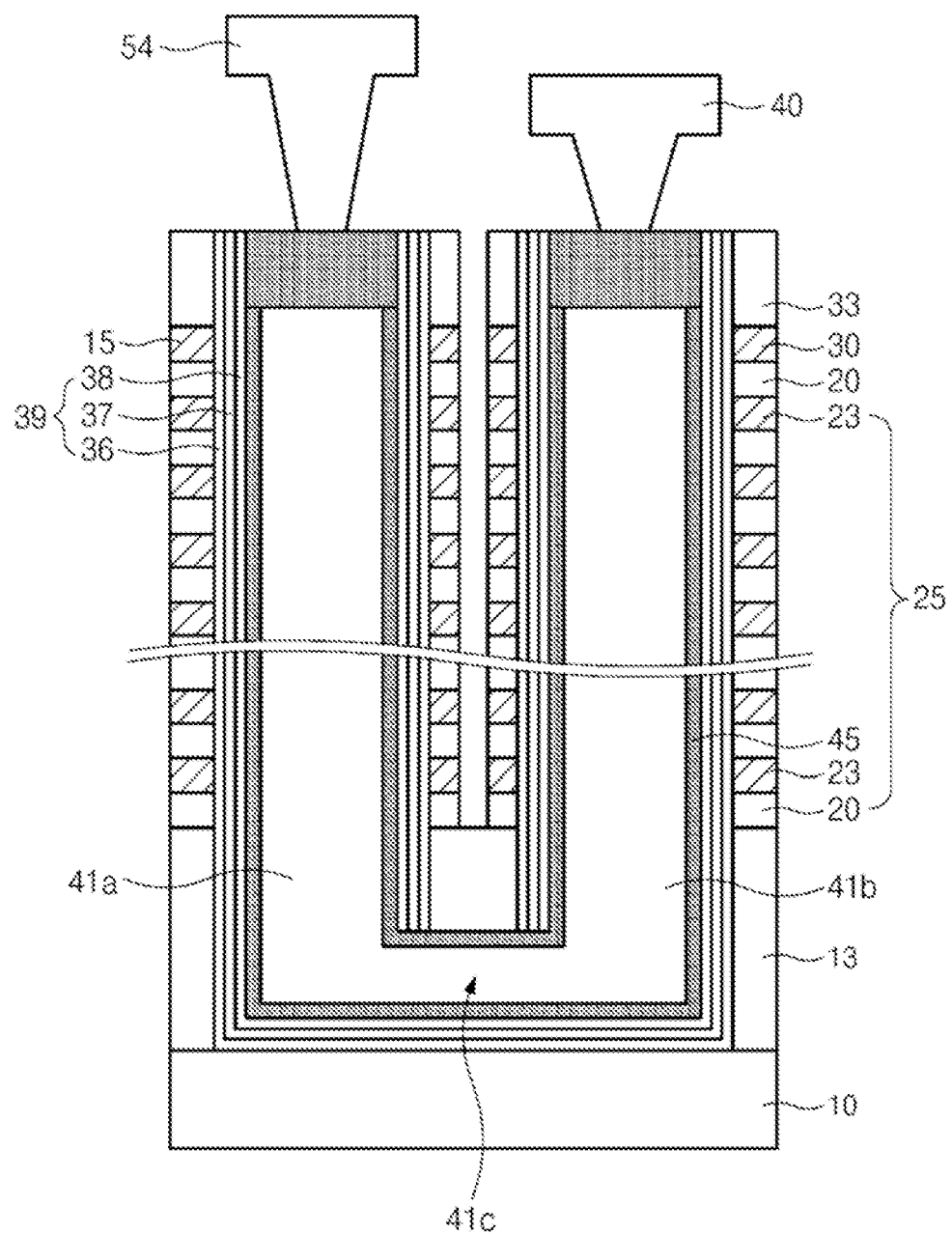
FIGS. 1A and 1B are a cross-sectional view and a circuit diagram illustrating a conventional semiconductor device.
Figure 1B:
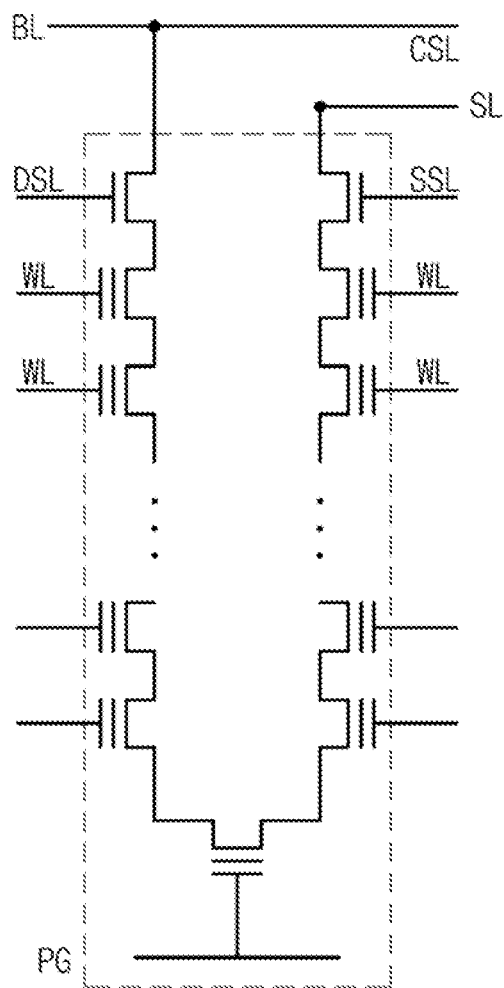
Figure 2A:
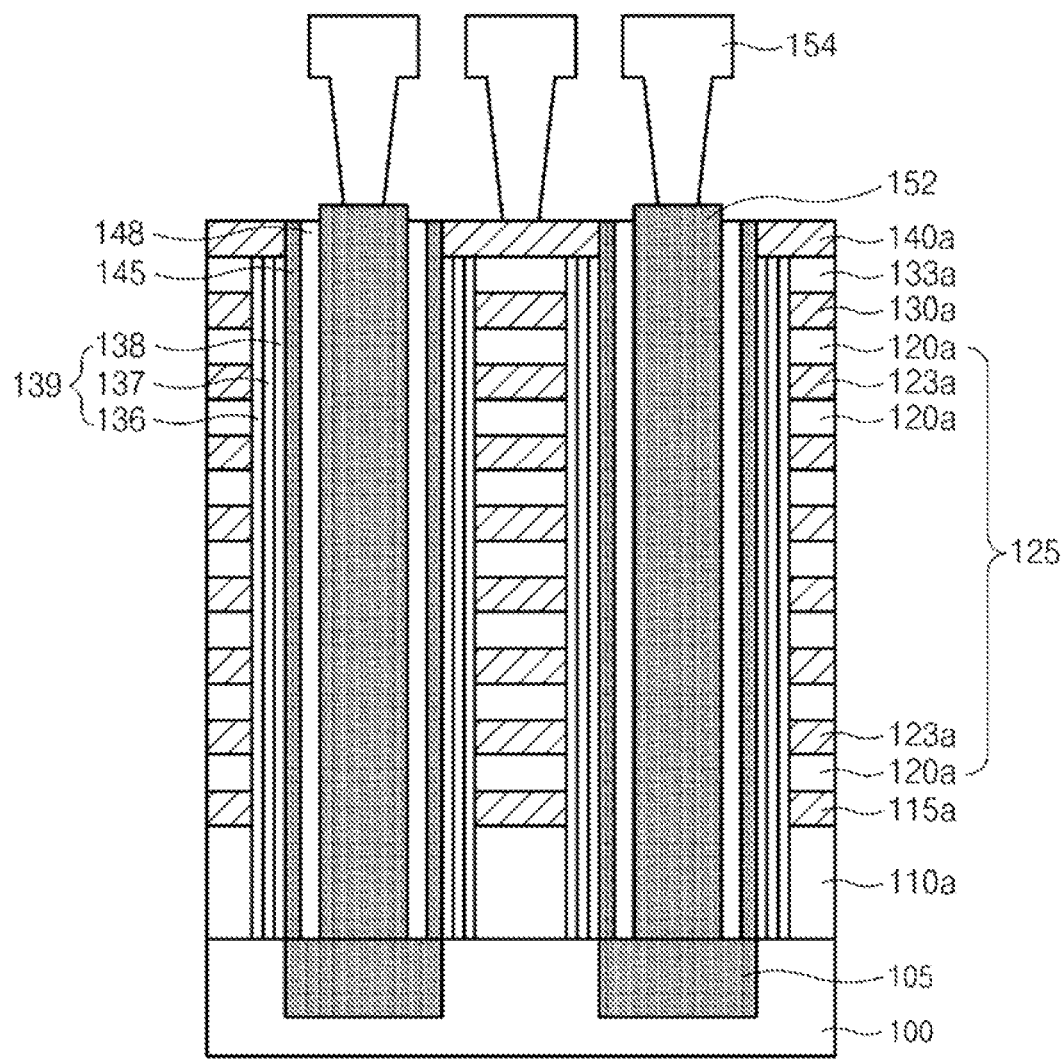
FIGS. 2A and 2B are a cross-sectional view and a circuit diagram illustrating a semiconductor device according to the embodiments.
Figure 2B:
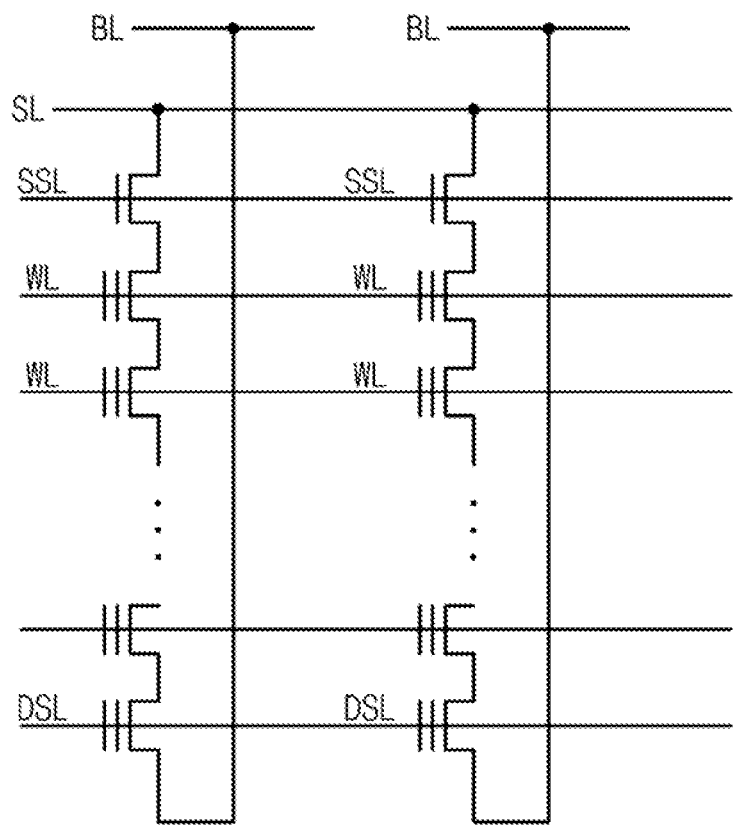

FIGS. 2A and 2B are a cross-sectional view and a circuit diagram illustrating a semiconductor device according to an embodiment.

Referring to FIGS. 2A and 2B, a channel portion 105 is formed in a semiconductor substrate 100. The semiconductor substrate 100 may be a P-type silicon substrate. The channel portion 105 may be formed by implantation of N-type impurities opposite to P-type impurities of the semiconductor substrate 100.

A first insulation film pattern 110a and a drain selection line (DSL) 115 are formed over the semiconductor substrate 100. A memory cell structure 125, formed by repeatedly stacking a second insulation film pattern 120a and a word line (WL) 123, is formed over the drain selection line (DSL) 115. A source selection line (SSL) 130 and a third insulation film pattern 133a may be formed over the memory cell structure 125.

The drain selection line (DSL) 115, the memory cell structure 125, and the source selection line (SSL) 130 are vertically stacked over the semiconductor substrate 100, resulting in formation of one cell string. A plurality of cell strings may be disposed over the semiconductor substrate 100. The word lines 123 included in the memory cell structure 125 may be repeatedly stacked by memory cells coupled to one cell string. The memory cells coupled to one cell string may be isolated from each other by the second insulation film pattern 120a. The memory cells arranged over the same layer in a horizontal direction may construct one page.

An ONO dielectric layer 139 that serves as a charge storage layer may be formed over sidewalls of a through-hole that passes through the first insulation film pattern 110a, the drain selection line (DSL) 115, the memory cell structure 125, the source selection line (SSL) 130, and the third insulation film pattern 133a. The ONO dielectric layer 139 may be formed by sequentially stacking a blocking layer, a charge trap layer, and a tunneling layer. A first channel region 145 may be formed over the ONO dielectric layer 139, which is formed over the sidewalls of the through-hole. As a result, the ONO dielectric layer 139 may be disposed between the memory cell structure 125 and the first channel region 145. The first channel region 145 may be coupled to the channel portion 105 formed in the semiconductor substrate 100.

A source line (SL) 140a coupled to the first channel region 145 is formed over the source selection line (SSL) 130. The source line (SL) 140a may extend parallel to the memory cell structure 125. The source line 140a for use in this embodiment is formed over the memory cell structure 125, so that additional space is unnecessary when the source line SL is coupled to an upper metal line, resulting in increased space utilization.

A second channel region 152 may be formed at the center part of the through-hole. The second channel region 152 may be isolated from the first channel region 145 by a fourth insulation film 148. The second channel region 152 may also be coupled to the channel portion 105, formed in the semiconductor substrate 100, and may be coupled to the first channel region 145 through the channel portion 105. A bit line (BL) 154 is formed over the second channel region 152 to be coupled to the second channel region 152. The bit line (BL) 154 may be extended perpendicular to the source line (SL) 140a.

As described above, since the source line (SL) 140a is formed over the memory cell structure 125, and the bit line (BL) 154 is formed at the center part of the cell string structure, additional space for coupling the source line (SL) 140a and the bit line (BL) 154 to the upper metal line need not be located outside the cell string structure. Accordingly, space utilization may increase and cell size may be reduced.

Figure 3A:
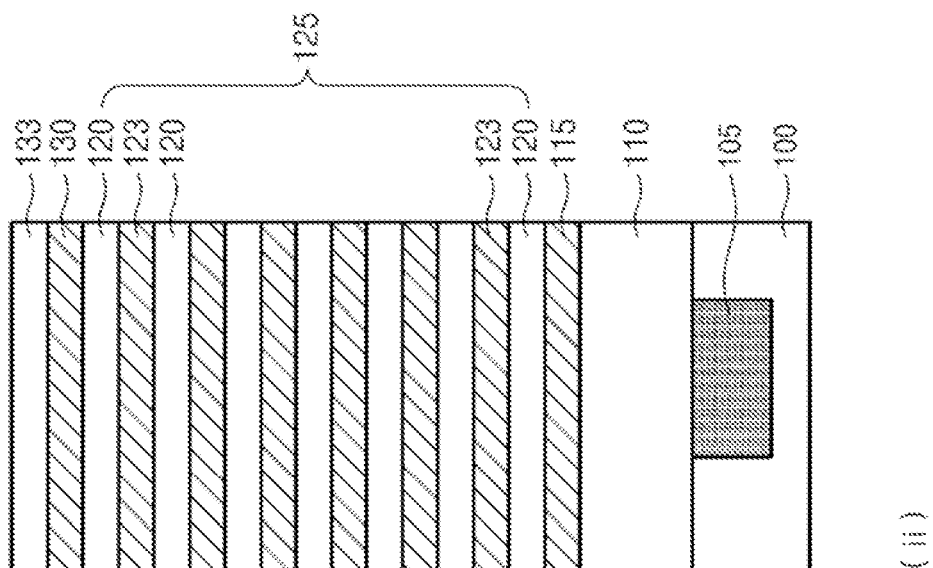
Figure 3A:
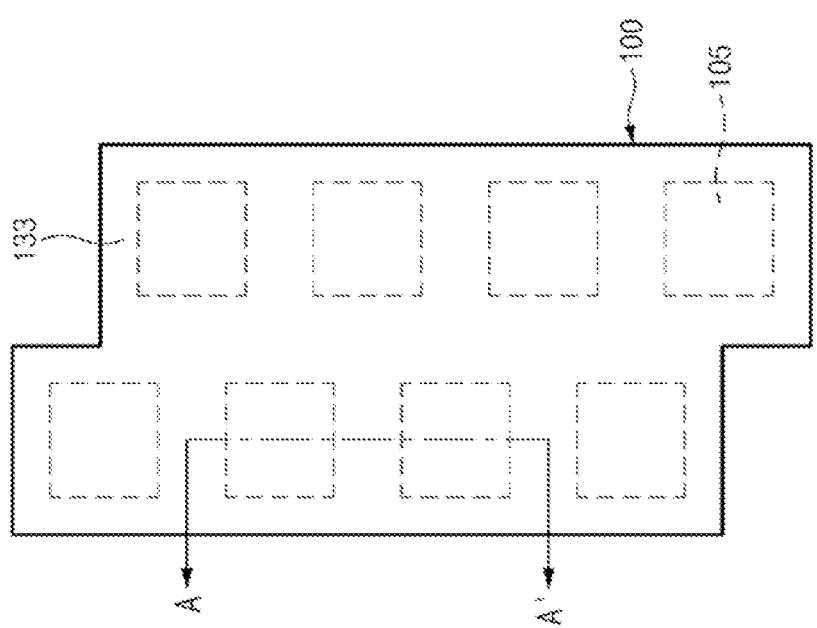

FIGS. 3A to 3I are plan views and cross-sectional views illustrating a method of fabricating a semiconductor device according to the embodiments. FIGS. 3A(i) to 3I(i) are plan views illustrating a method of fabricating the semiconductor device according to the embodiments. FIGS. 3A(ii) to 3I(ii) are cross-sectional views illustrating the semiconductor device taken along the line A-A' of FIGS. 3A(i) to 3I(i).

Referring to FIG. 3A, the channel portion 105 is formed in the semiconductor substrate 100. The semiconductor substrate 100 may be a P-type silicon substrate. The channel portion 105 may be formed by implantation of N-type impurities, which are opposite to the P-type impurities of the semiconductor substrate 100. The channel portion 105 may be formed to facilitate a connection between the channel regions in a subsequent process. If necessary, the channel portion 105 may be omitted. The channel portion 105 may be disposed in a zigzag manner when seen in plan view.

The first insulation film 110 is formed over the semiconductor substrate 100 including the channel portion 105, and the drain selection line (DSL) material 115 is formed over the first insulation film 110. The drain selection line (DSL) material 115 may be formed by depositing a doped polysilicon film, a metal film, or a conductive material to a thickness ranging from approximately 10 Å to approximately 1000 Å.

The second insulation film 120 is formed over the drain selection line (DSL) material 115 in order to isolate the drain selection line (DSL) material 115 from the word line material 123 to be formed. The word line material 123 is formed over the second insulation film 120 by depositing a conductive material (not shown) over the second insulation film 120. Thereafter, the second insulation film 120 and the word line 123 are repeatedly stacked several times. As a result, the memory cell structure 125 is formed.

The word lines material 123 included in the memory cell structure 125 may be repeatedly stacked by the number of memory cells coupled to one cell string. The word line material 123 may be formed of a doped polysilicon layer, a polysilicon germanium material, a metal film, or a combination thereof. However, the word line material 123 is not limited thereto, and it should be noted that the word line material 123 may also be formed of any conductive material without departing from the scope or spirit of the present invention. The second insulation film 120 may be used to isolate between vertically-stacked memory cells, and may be formed of a silicon oxide film, a silicon nitride film, or a combination thereof.

Thereafter, the source selection line (SSL) material 130 is formed over the second insulation film 120 by depositing a conductive material (not shown) over the second insulation film 120, and the third insulation film 133 is formed over the source selection line (SSL) material 130 so as to isolate the source selection line (SSL) material 130 from the upper metal line (not shown).

Figure 3B:
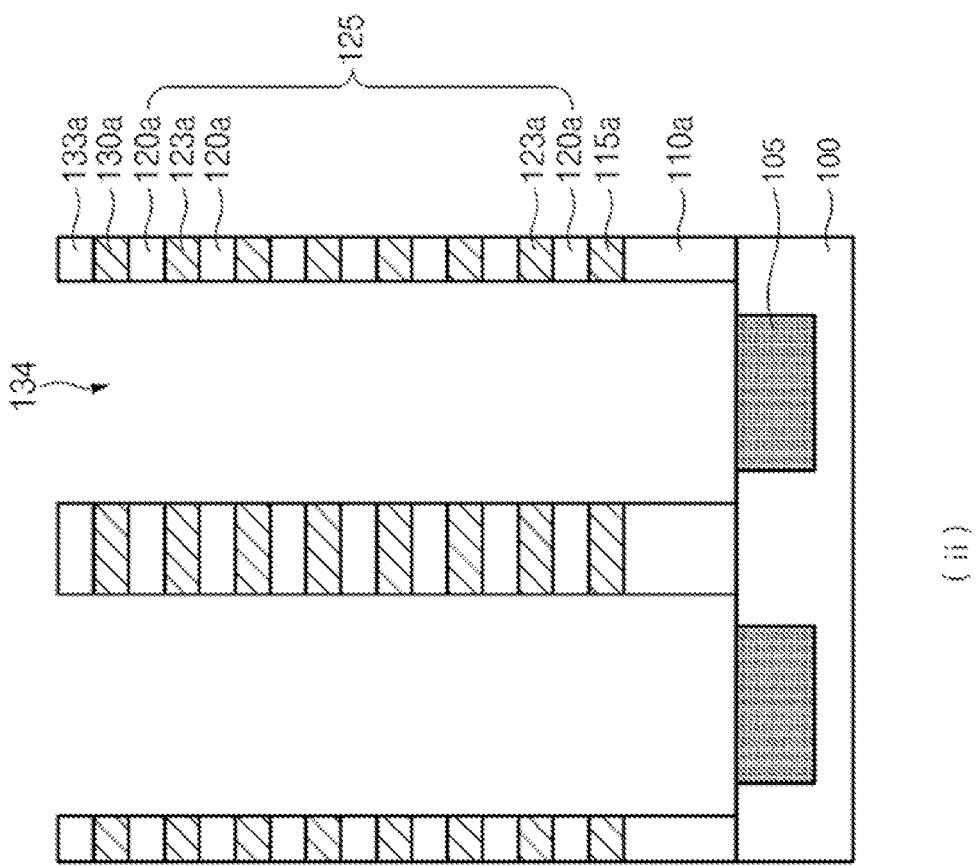
Figure 3B:
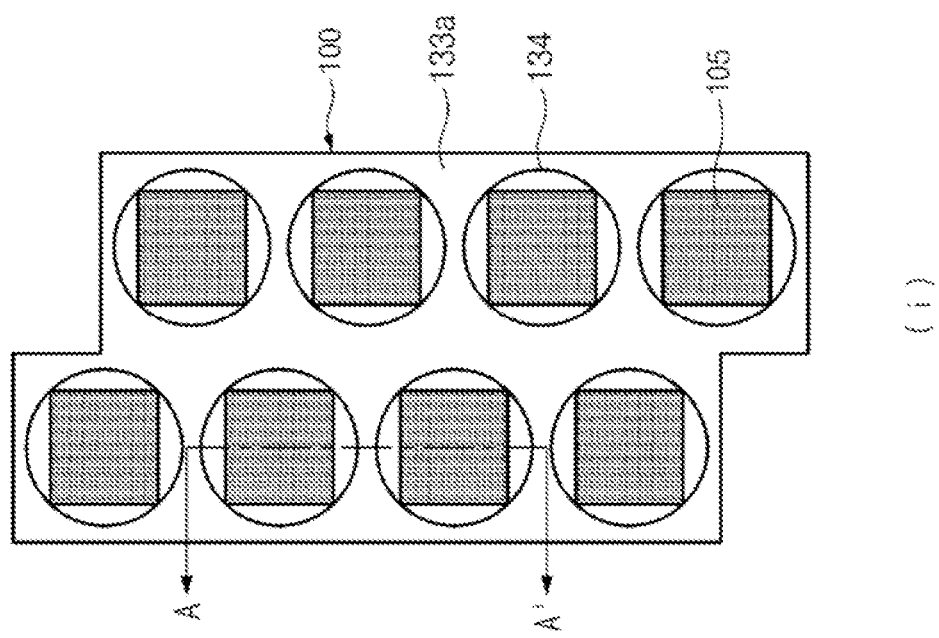

Referring to FIG. 3B, the third insulation film 133, the source selection line (SSL) material 130, the memory cell structure 125, the drain selection line (DSL) material 115, and the first insulation film 110 are sequentially etched so that a third insulation film pattern 133a, a source selection line (SSL) 130a, the memory cell structure 125, a drain selection line (DSL) 115a, and a first insulation film pattern 110a are formed and a first through-hole 134 exposing the channel portion 105 formed in the semiconductor substrate 100 The first through-hole 134 may be etched by wet etching or dry etching, and may be formed to have a diameter ranging from approximately 10 Å to approximately 1000 Å. During the etching of the first through-hole 134, since the channel portion 105 formed in the semiconductor substrate 100 is used as an etch stop film, the etching process may be stopped when the channel portion 105 is exposed.

Figure 3C:
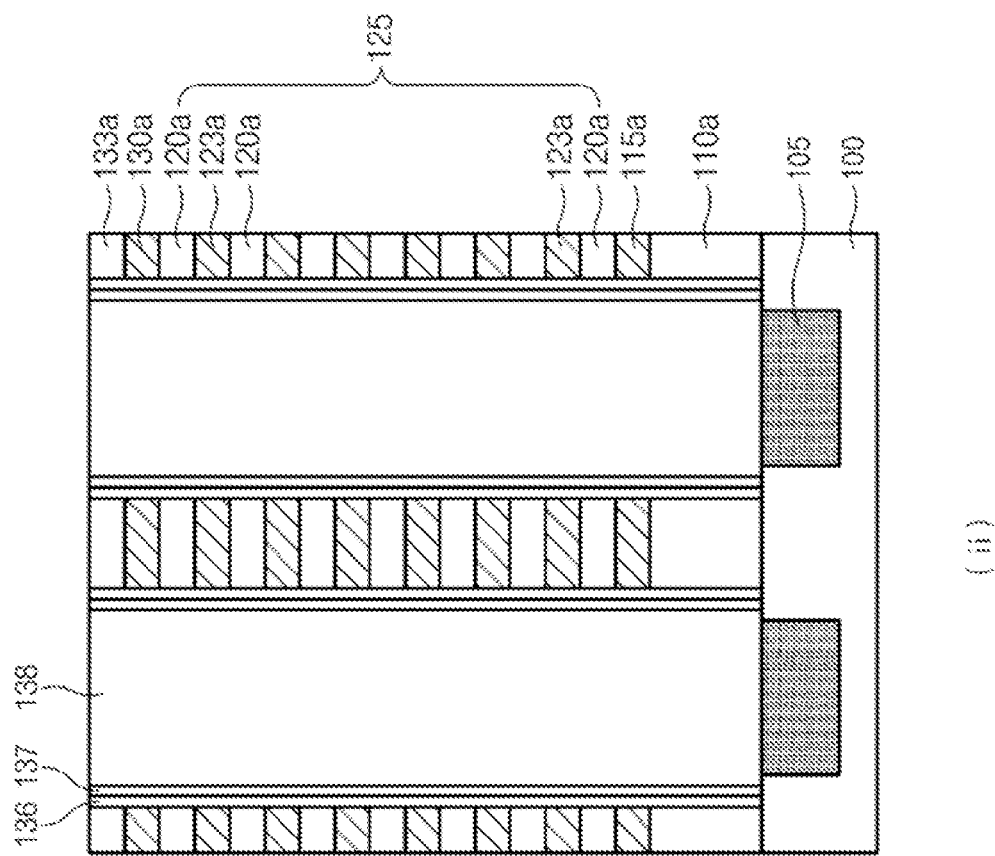
Figure 3C:
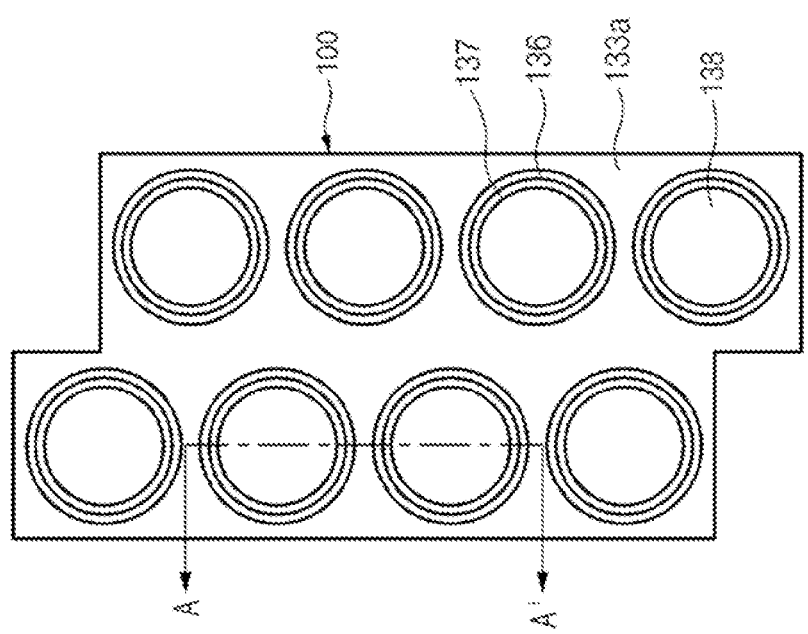

Referring to FIG. 3C, a first oxide film (not shown) and a nitride film (not shown), each of which has a predetermined thickness, may be deposited over an entire surface of the semiconductor substrate 100 including the first through-hole 134. The first oxide film and the nitride film may be a first oxide pattern 136 and a nitride pattern 137 used as the blocking layer and the charge trap layer, respectively.

In detail, the blocking layer may prevent movement of charges originating from the nitride film serving as the charge trap layer. The first oxide film serving as the blocking layer may be formed by depositing an oxide material using a Chemical Vapor Deposition (CVD) method. For example, the first oxide film may be formed of a high-K material, for example, aluminum oxide ($Al_2O_3$), hafnium oxide ($HfO_2$), zirconium dioxide ($ZrO_2$), hafnium aluminum oxide (HfAlO), hafnium silicon oxide (HfSiO), etc. After forming the first oxide film, a Rapid Thermal Anneallng (RTA) process is performed on the semiconductor substrate 100 including the first oxide film.

After forming the first oxide film, the nitride film serving as the charge trap layer is deposited to a thickness ranging from approximately 10 Å to approximately 1000 Å. For example, the nitride film may be formed of a silicon nitride film or a polysilicon film. The nitride film may be formed by an Atomic Layer Deposition (ALD) or Chemical Vapor Deposition (CVD) method.

Subsequently, an etch-back process is performed on the first oxide film and the nitride film so that the first oxide pattern 136 and the nitride pattern 137 remain only at the sidewalls of the first through-hole 134. As a result, the channel portion 105 is exposed at a lower part of the first through-hole 134.

Thereafter, a second oxide film (not shown) may be deposited over an entire surface of a resultant structure to fill the first through-hole 134 in which the first oxide pattern 136 and the nitride pattern 137 are formed. An etching process is performed on the second oxide film to form a second oxide pattern 138 which is buried in the first through-hole 134 in which the first oxide pattern 136 and the nitride pattern 137 are formed. After the etching process, the second oxide pattern 138 may be used as the tunneling layer of the memory cell. The second oxide pattern 138 serving as the tunneling layer may be formed of a silicon oxide nitride (SiON) material by performing a deposition process under a mixed atmosphere of oxygen and nitrogen. In addition, after forming the second oxide film, the second oxide film is annealed under an atmosphere of nitric oxide (NO) gas or nitrous oxide ($N_2O$) gas, so that the quality of the second oxide film may be improved.

Figure 3D:
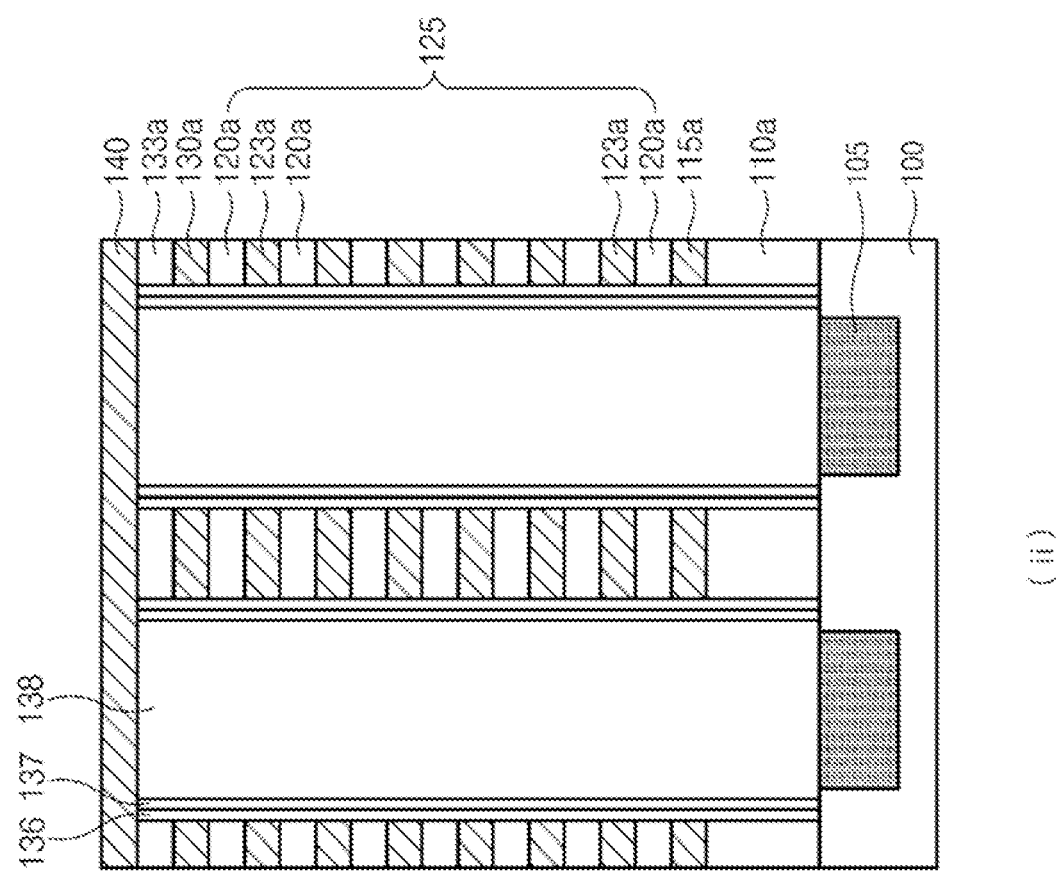
Figure 3D:
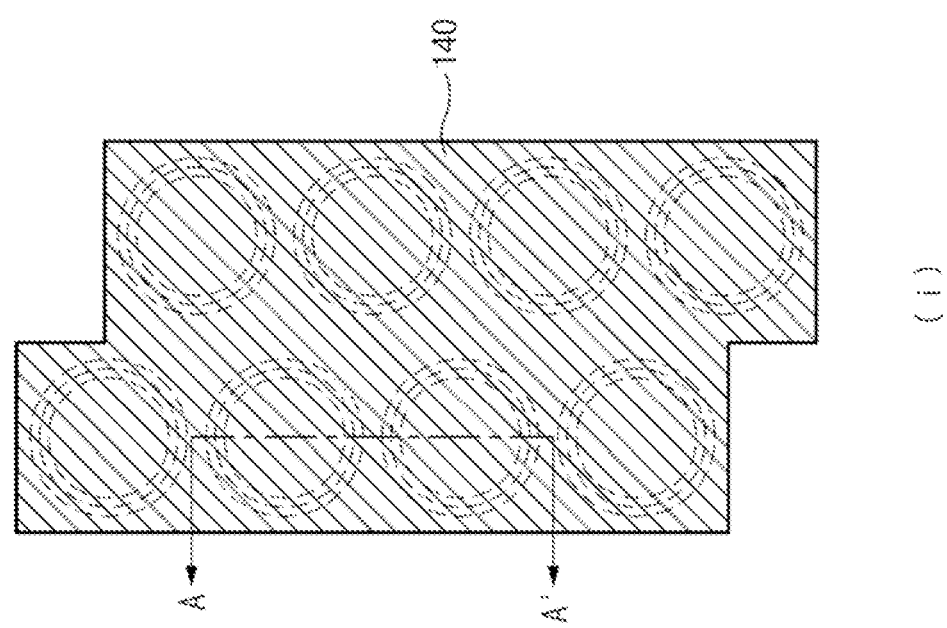

Referring to FIG. 3D, the source line (SL) material 140 is formed over an entire surface of a resultant structure including the first through-hole 134 in which the second oxide pattern 138 is buried.

Figure 3E:
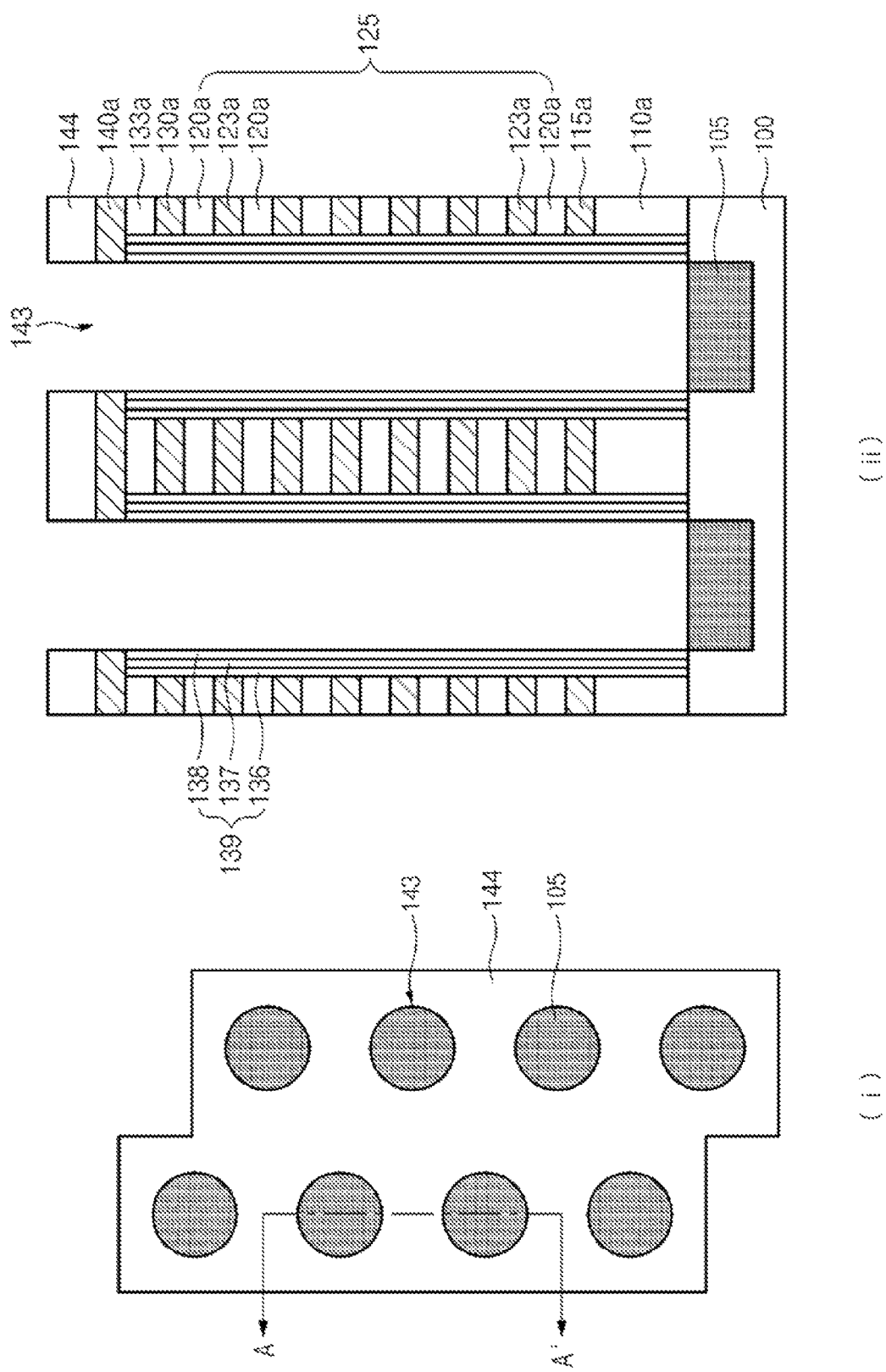

Referring to FIG. 3E, a first mask pattern 144 defining the channel region is formed over the source line (SL) material 140. The first mask pattern 144 may be formed to cover a part of the second oxide pattern 138, which is adjacent to the nitride pattern 137. Here, the part of the second oxide pattern 138 has substantially the same thickness as that of the nitride pattern 137, e.g., a critical dimension (CD) ranging from approximately 10 Å to 1000 Å.

The source line (SL) material 140 and the second oxide pattern 138 exposed by the first mask pattern 144 are etched to form a second through-hole 143 and a source line (SL) 140a. By this etching process, the ONO dielectric layer 139 serving as the charge storage layer is formed over the sidewalls of the first through-hole 134 to define the second through-hole 143. Thereafter, the first mask pattern 144 is removed. Although this embodiment first forms the first oxide pattern 136 and the nitride pattern 137, additionally etches the second oxide pattern 138, and thus forms the ONO dielectric layer 139 for convenience of description and better understanding of the present invention, the method of fabricating the ONO dielectric layer 139 is not limited thereto. For example, the first oxide film, the nitride film, and the second oxide film may be sequentially deposited in the first through-hole 134 and then etched back, so that the ONO dielectric layer 139 may also be formed over the sidewalls of the first through-hole 134.

Referring to FIG. 3F, the first channel region 145 is formed over sidewalls of the second through-hole. The source line (SL) 140a coupled to the first channel region 145 is disposed at both sides of the first channel region 145. The source line (SL) 140a shown in FIG. 3F is formed over the memory cell structure 125 so that an additional space needed for connecting the source line (SL) 140a to the upper metal line is no longer required. That is, space utilization of the semiconductor device may increase and the cell size may be reduced.

The first channel region 145 may be formed of an impurity-doped polysilicon film or a conductive metal film. A lower part of the first channel region 145 may be coupled to the channel portion 105 formed in the semiconductor substrate 100.

To form the first channel region 145, a conductive material (not shown) is deposited over the semiconductor substrate 100 including the second through-hole 143. Thereafter, an etching process is performed on the conductive material to form the first channel region 145 which remains only over the sidewalls of the second through-hole 143.

Alternatively, a mask pattern (not shown) may be used to form the first channel region 145. In more detail, after a conductive material (not shown) is buried in the second through-hole 143, the mask pattern may be formed to cover only a specific part of the conductive material. The conductive material is etched using the mask pattern (not shown) as an etch mask so as to form the first channel region 145, which remains only over the sidewalls of the second through-hole 143.

Where the first channel region 145 is formed over the semiconductor substrate 100 in which the channel portion 105 is not formed, by performing an etching process on the conductive material in a manner that the conductive material remains at a lower part of the second through-hole 143, a second channel region 152 (See FIG. 3I) to be formed in a subsequent process may be coupled to the first channel region 145.

Referring to FIG. 3G, the fourth insulation film 148 is buried in the second through-hole 143 including the first channel region 145. A second mask pattern 149 exposing the center part of the second through-hole 143 is formed over the source line 140a, the first channel region 145, and the fourth insulation film 148. The second mask pattern 149 may be formed in a manner such that a part of the fourth insulation film 148 that is adjacent to the first channel region 145 is not exposed.

Referring to FIG. 3H, the fourth insulation film 148 is etched using the second mask pattern 149 as an etch mask, so that a third through-hole 150 exposing the center part of the channel portion 105 formed in the semiconductor substrate 100 is formed. In this case, the part of the fourth insulation film 148 adjacent to the first channel region 145 remains over sidewalls of the first channel region, and thus, the third through-hole 150 may be isolated from the first channel region 145 by the fourth insulation film 148.

Figure 3I:
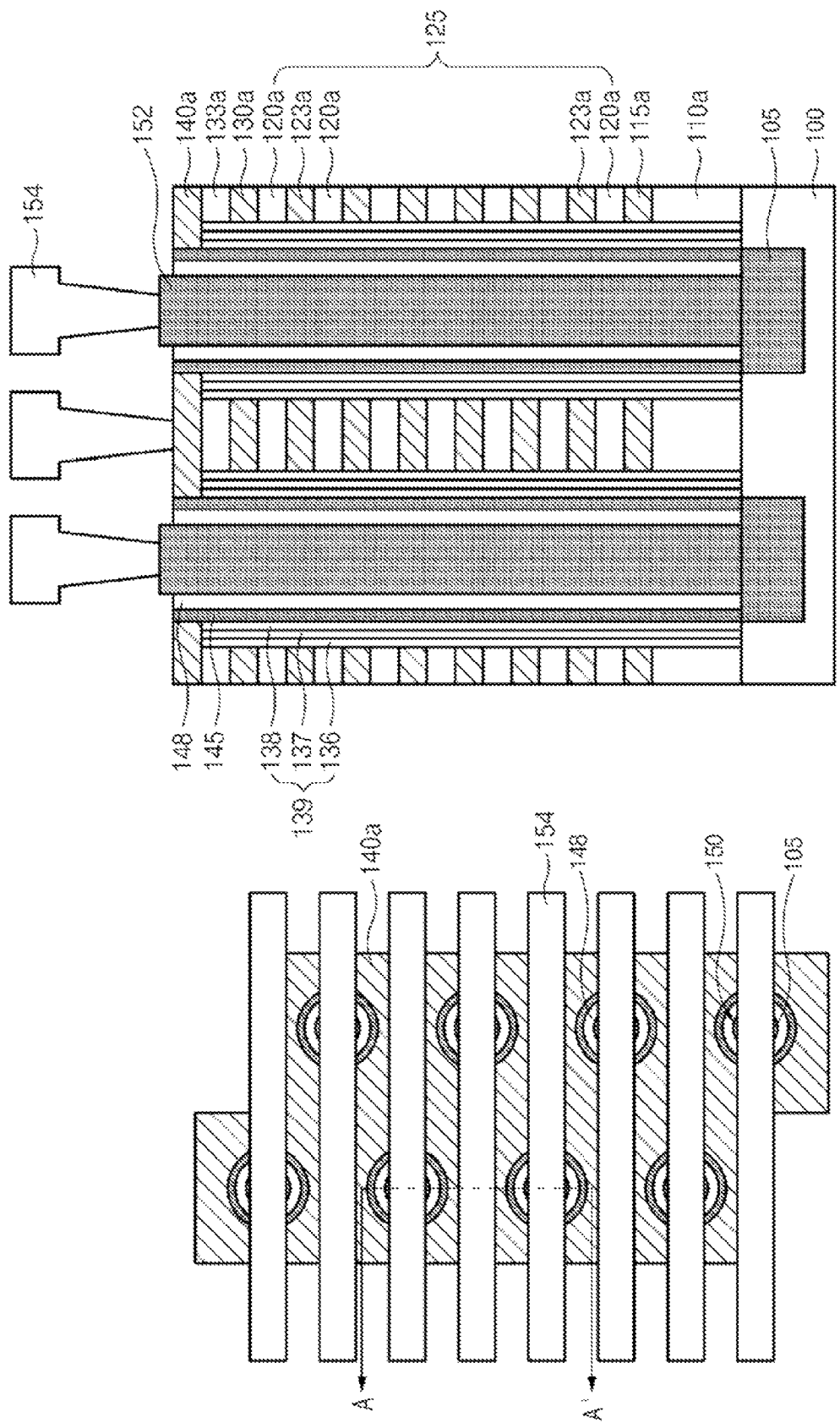

Referring to FIG. 3I, the second channel region 152 is formed by burying a conductive material in the third through-hole 150. The second channel region 152 may also be coupled to the channel region 105, and the first channel region 145 and the second channel region 152 may be interconnected by the channel portion 105.

Thereafter, the bit line (BL) 154 is coupled to the second channel region 152, and may be extended perpendicular to the source line (SL) 140a. In other words, since the bit line (BL) 154 is located at the center part of the cell string structure, an additional space for coupling the bit line (BL) 154 to the upper metal line need not be located outside of the cell string structure. Accordingly, space utilization may be increased and the cell size may be reduced.

As is apparent from the above description, the coupling region between the source line and the bit line is located in the cell string structure, so that the semiconductor device and the method of fabricating the same according to the embodiments provide the following effects.

First, an additional space for coupling the source line and the bit line to an upper metal line is no longer required, resulting in increased space utilization.

Second, the number of fabrication steps is reduced relative to the number of conventional Pipe Gate (PG) formation steps.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present invention are illustrative and not limitative. Various alternatives and equivalents are possible. The invention is not limited by the type of deposition, etching, polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A semiconductor device comprising:
a memory cell structure formed over a semiconductor substrate;
a channel connector formed in the semiconductor substrate;
a through-hole formed to pass through the memory cell structure;
a first channel region formed over sidewalls of the through-hole; and
a second channel region formed at a center part of the through-hole and isolated from the first channel region by an insulation film in the through-hole,
wherein the first channel region and the second channel region are indirectly connected to each other through the channel connector.

2. The semiconductor device according to claim 1, wherein a lower part of the first channel region is coupled to a lower part of the second channel region.

3. The semiconductor device according to claim 1, further comprising:
a drain selection line (DSL) formed below the memory cell structure; and
a source selection line (SSL) formed over the memory cell structure.

4. The semiconductor device according to claim 1, further comprising:
a source line formed over the memory cell structure, coupled to the first channel region at both sides of the first channel region, and extended parallel to the memory cell structure.

5. The semiconductor device according to claim 1, further comprising:
a bit line coupled to an upper part of the second channel region, and extended perpendicular to the memory cell structure.

6. The semiconductor device according to claim 1, wherein the memory cell structure is formed by alternately stacking an insulation film and a word line over the semiconductor substrate.

7. The semiconductor device according to claim 6, wherein the word line includes polysilicon or metal.

8. The semiconductor device according to claim 1, further comprising:
a charge storage region formed over the sidewalls of the through-hole, and disposed between the memory cell structure and the first channel region.

9. The semiconductor device according to claim 8, wherein the charge storage region includes an oxide-nitride-oxide (ONO) dielectric layer.

* * * * *